United States Patent [19]
Herrick et al.

[11] Patent Number: 4,940,932
[45] Date of Patent: Jul. 10, 1990

[54] METHOD AND APPARATUS FOR TESTING DYNAMOELECTRIC MACHINE ROTORS

[75] Inventors: Phillip R. Herrick; Daniel C. Ewing; Floyd H. Wright; Kevin M. Truelove, all of Fort Wayne, Ind.

[73] Assignee: General Electric Company, Fort Wayne, Ind.

[21] Appl. No.: 269,500

[22] Filed: Nov. 10, 1988

Related U.S. Application Data

[62] Division of Ser. No. 860,240, May 6, 1986, Pat. No. 4,801,877.

[51] Int. Cl.$^5$ .............................................. G01R 31/06
[52] U.S. Cl. .............................. 324/158 MG; 322/99; 324/545
[58] Field of Search ................. 324/158 MG, 545; 318/490; 322/99; 310/68 R; 340/648; 364/551.01

[56] References Cited

U.S. PATENT DOCUMENTS

| | | | |
|---|---|---|---|
| 2,568,406 | 9/1951 | Packer et al. | 324/158 MG |
| 2,640,100 | 5/1953 | Packer et al. | 324/158 MG |
| 2,844,794 | 7/1958 | Wright et al. | 324/158 MG |
| 3,683,493 | 8/1972 | Begovich | 29/598 |
| 3,861,025 | 1/1975 | Sims | 324/158 MG |
| 3,875,511 | 4/1975 | Sims | 324/158 MG |

FOREIGN PATENT DOCUMENTS

| | | | |
|---|---|---|---|
| 45-26126 | 8/1970 | Japan | 324/158 MG |
| 1296969 | 3/1987 | U.S.S.R. | 324/158 MG |

Primary Examiner—Ernest F. Karlsen
Attorney, Agent, or Firm—Ralph E. Krisher, Jr.

[57] ABSTRACT

A method and apparatus for testing dynamoelectric machine rotors, particularly squirrel cage rotors for induction motors, to obtain resistance, reactance, and effective skew values to permit identification of rotor defects. The rotor is rotated in an alternating magnetic field and pick-up coils are used to sense the voltage generated in the rotor by sensing the magnetic flux generated by magnetization of the rotor during rotation. Current sensing is used to determine the current used in magnetizing the rotor and a separate skew pick-up coil is utilized to detect effective electrical skew. These signals are processed to determine whether the rotor meets predetermined pass/fail criteria, to provide detailed statistical data and to generate a failure indication responsive to one of the values falling outside respective predetermined limits.

16 Claims, 12 Drawing Sheets

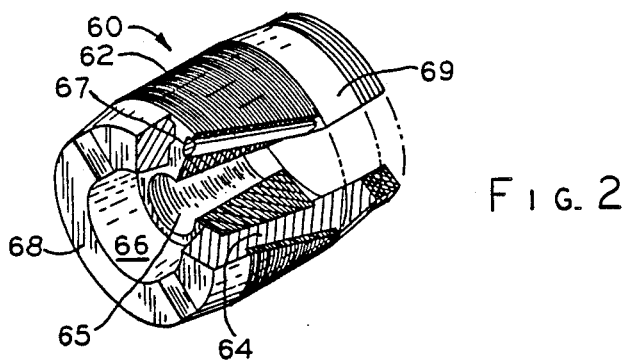
F I G. 2
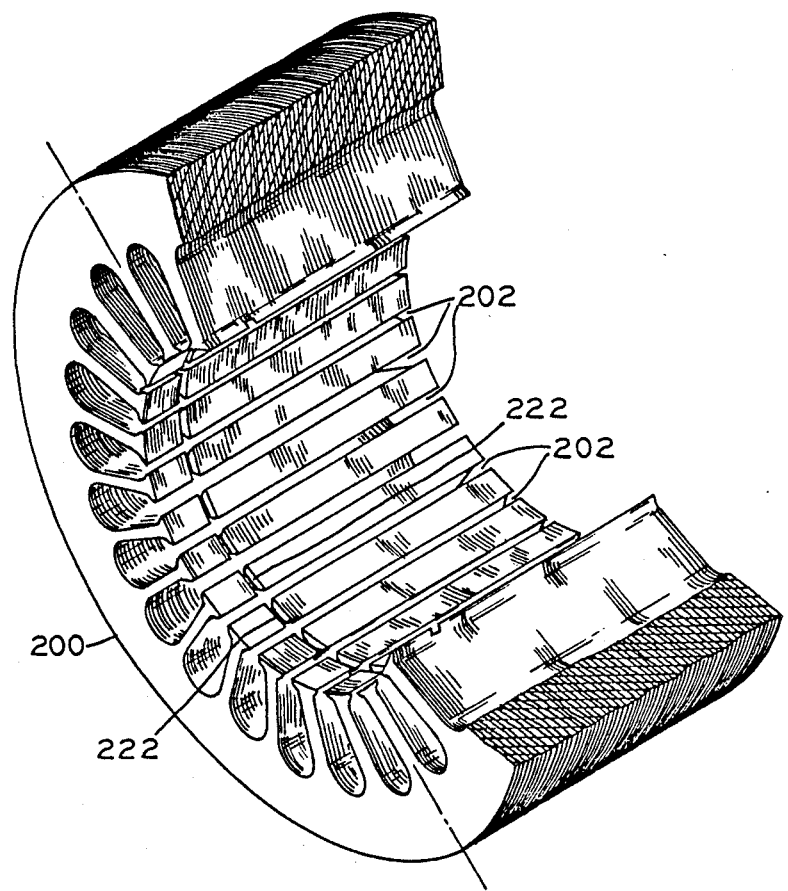
F I G. 4

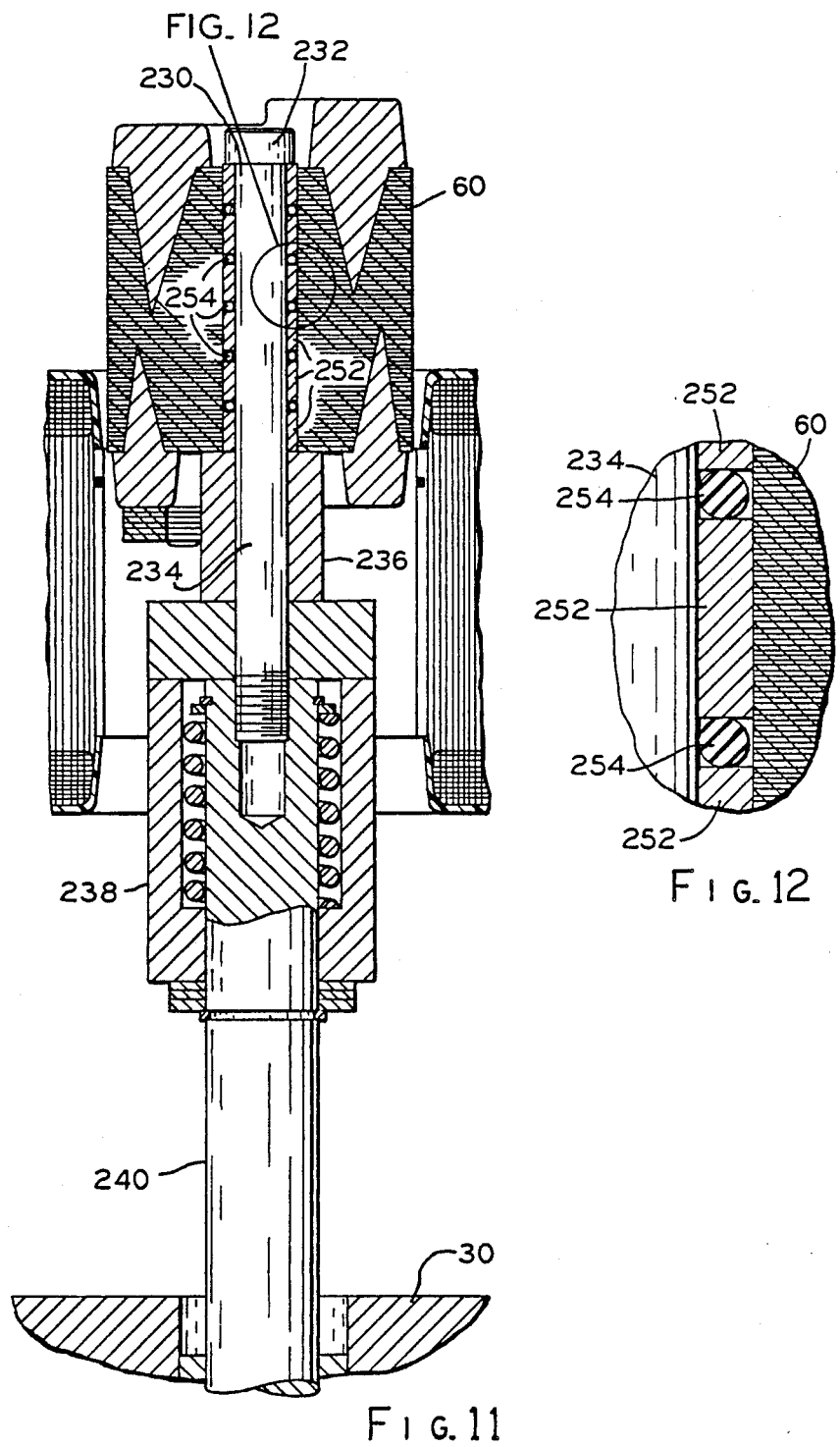

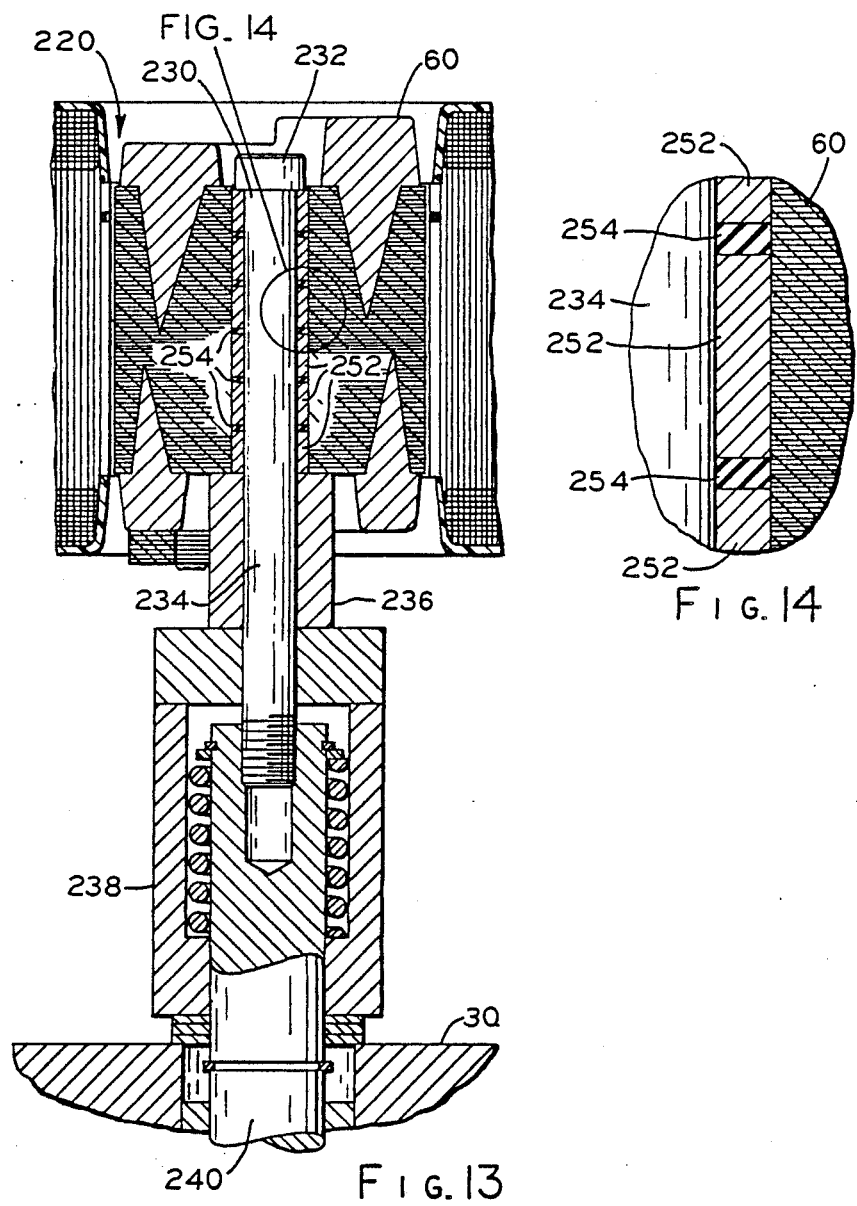

METHOD AND APPARATUS FOR TESTING DYNAMOELECTRIC MACHINE ROTORS

This is a division, of application Ser. No. 860,240, filed May 6, 1986, now U.S. Pat. No. 4,801,877.

FIELD OF THE INVENTION

This invention relates generally to the field of testing rotors of dynamoelectric machines, such as electric motors and generators, and more particularly to a method and apparatus for testing squirrel cage rotors for induction motors to obtain the resistance, reactance, and effective electrical skew of the rotor to permit identification of rotor defects.

BACKGROUND OF THE INVENTION

Squirrel cage rotors for modern induction motors typically include a core comprised of a stack of steel laminations and an aluminum squirrel cage conductor arrangement, usually formed as a die casting. Manufacturing techniques have been perfected to the point where these rotors are mass produced with a high probability of uniformity and high quality. There are, however, a number of possibilities for deficiencies, including porosity or impurities in the aluminum casting and open circuits in the squirrel cage conducting bars which can affect the electrical resistance of the rotor, poor insulation between the squirrel cage conductors and the iron core which can produce undesired variations in the effective skew, and various other manufacturing defects. Thus it is desirable to test dynamoelectric machine rotors economically and reliably to detect such defects.

Because quality problems are generally infrequent, it is not economical to perform expensive tests on every individual rotor. However, since hidden defects do occur, in order to maintain a high degree of quality control there is a need to perform low cost tests on each rotor before it is assembled with a stator to form a complete machine. Further, it can be desirable to obtain information on the resistance, reactance and effective skew of the rotors for evaluation of defects, manufacturing processes and quality control.

A number of prior art methods have been developed in an attempt to test squirrel cage rotors. Some, such as that disclosed in U.S. Pat. No. 2,844,794, assigned to the assignee of the present invention, require the use of the dynamoelectric machine stator core, while others use destructive testing techniques. One non-destructive prior art technique for testing rotors independent of the stator is disclosed in U.S. Pat. No. 3,861,025, assigned to the assignee of the present invention. This technique involves rotating the rotor in a static magnetic field and evaluating the waveform of the resulting induced voltages displayed on an oscilloscope. This technique requires extensive operator training to interpret the oscilloscope display, and has inherent limitations on the results that can be achieved. Another prior art testing technique utilizes a stator fixture excited by a fixed AC current into which the rotor is placed and manually rotated to obtain a peak power measurement (i.e. power into the rotor) using a pick-up coil. By using the current measurement, the impedance of the rotor can be obtained, but separate resistance, reactance and skew information can not be determined.

It is accordingly an object of the present invention to provide a novel and improved method and apparatus for non-destructive testing of dynamoelectric machine rotors.

It is another object of the invention to provide a novel, economical, and reliable method and apparatus for non-destructive measurement of the resistance and reactance of dynamoelectric machine rotors.

It is yet another object of the invention to provide a novel, economical and reliable method and apparatus for non-destructive measurement of the effective skew of dynamoelectric machine rotors.

It is yet another object of the invention to provide a novel, economical, and reliable method and apparatus for non-destructive testing of dynamoelectric machine rotors which provides automatic pass/fail determinations.

It is still another object of the invention to provide a novel, economical, and reliable method and apparatus for non-destructive testing of dynamoelectric machine rotors including the measurement of resistance, reactance and skew and a detailed statistical comparison and evaluation of the measurement results, as well as automatic identification of defective rotors.

SUMMARY OF THE INVENTION

Briefly, according to preferred embodiments of the invention, a test apparatus and method is provided for testing dynamoelectric machine rotors. The apparatus comprises a test head for accepting and causing relative angular movement between the rotor and test head and includes exciting means for magnetizing the rotor during such angular movement in response to an alternating current. Voltage sensing means is provided for generating a voltage signal responsive to the magnetic flux variations generated by the rotor in response to the magnetization by the exciting means. Current sensing means is provided for sensing the magnitude of the alternating current utilized to magnetize the rotor and for generating a current signal representative thereof. Processing means is provided for determining the resistance and reactance of the rotor responsive to the voltage signal and current signal.

In addition skew sensing means may be provided for sensing the effective electrical skew of the rotor and for generating an effective skew signal responsive thereto. The processing means is usable for determining an effective electrical skew of the rotor responsive to the effective skew signal.

The subject matter of the invention is particularly pointed out and distinctly claimed in the claims at the concluding portion of this specification. The invention itself, both as to its organization and method of operation, together with further objects and advantages thereof, may best be understood by reference to the following description taken in conjunction with the accompanying drawings.

BRIEF DESCRIPTION OF THE DRAWINGS

FIG. 2 is a cut-away perspective view illustrating a specific embodiment of a typical squirrel cage rotor.

FIG. 4 is a cut-away perspective view illustrating the core configuration of a specific embodiment of the test head of the test apparatus illustrated in FIG. 3.

FIG. 11 is an expanded diagrammatic view illustrating a specific embodiment of the test head and rotor clutch mechanism illustrated in FIG. 9 in the rotor extended position.

FIG. 12 is an expanded view of a portion of the rotor clutch mechanism illustrated in FIG. 11.

FIG. 13 is an expanded diagrammatic view illustrating a specific embodiment of the test head and rotor clutch mechanism illustrated in FIG. 10 in the rotor retracted position.

FIG. 14 is an expanded view of a portion of the rotor clutch mechanism illustrated in FIG. 13.

DETAILED DESCRIPTION OF THE PREFERRED EMBODIMENTS

Figure 1:
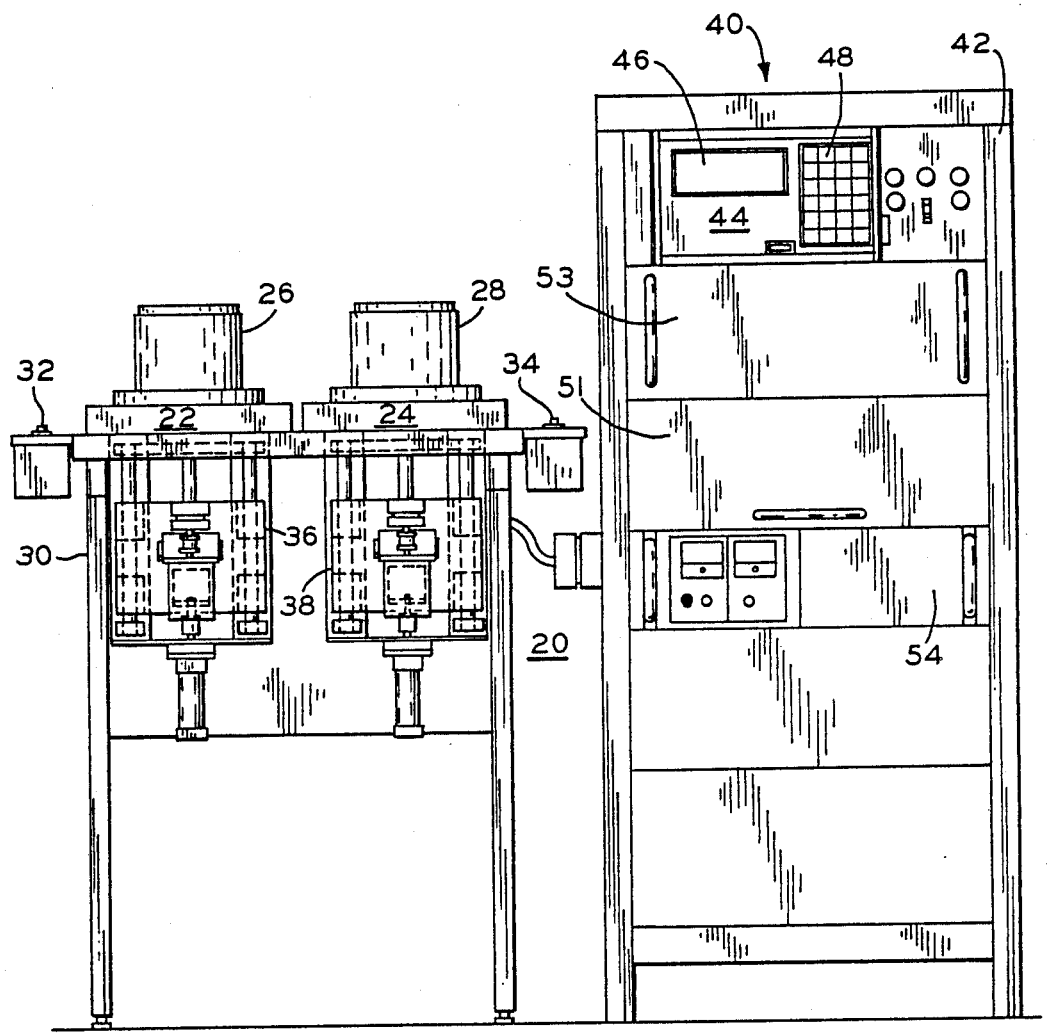
FIG. 1 is a diagrammatic front view illustrating a specific embodiment of a dynamoelectric machine rotor test apparatus for testing squirrel cage rotors in accordance with the invention.

FIG. 1 is a general diagrammatic front view illustrating a preferred embodiment of the dynamoelectric machine rotor test apparatus 20 according to the invention. The test apparatus 20 is a dual test fixture embodiment having two test fixtures 22, 24. Other embodiments utilizing one fixture or more than two fixtures will be apparent to those skilled in the art in view of the disclosure provided hereinafter. The two test fixtures 22, 24 each respectively comprise a test head 26, 28 and a hydraulically driven retraction and drive mechanism 36, 38. The retraction and drive mechanism 36, 38 functions to retract and rotate the rotor within the test head in response to activation of a start button 32, 34 associated with the respective test fixtures 22, 24. The test fixtures 22, 24 are mounted, as shown, in a test stand 30 to provide convenient access by an operator.

Each test fixture 22, 24 is coupled to a data acquisition, processing and control system 40 mounted in a rack 42 as shown. The system 40 comprises data acquisition and processing circuitry in a drawer 51, coupled to a terminal 44, and to a printer (e.g., an Epson RX-80) contained in a drawer 53, and coupled to a power supply 54. The terminal 44 comprises a display 46 (e.g., a Computerwise, Inc., Transterm Model TM-71 LCD Display) for displaying test results, control information, and other data, and a keyboard 48, (e.g., a Computerwise, Inc. Transterm Model TM-71 16-key, alpha/numeric keyboard) for entry of data and control information. The printer permits the printing of results and other data, while the power supply 54 provides electrical power for all of the electrical elements of the apparatus 20.

The single common data acquisition, processing and control system 40 controls testing and acquires data from each test head 22, 24 independently. In response to initiation of a test on a respective fixture 22, 24 by a operator, the system 40 automatically performs the rotor test on the respective test fixture. Thus, once the test sequence is initiated by the operator, the system 40 controls the rotation of the rotor within the fixture, the acquisition of data via the fixture, and the processing of the acquired data without further operator intervention.

A typical squirrel cage rotor suitable for testing by the apparatus 20 is illustrated in FIG. 2. The rotor 60 includes a cylindrical core 62 formed of a stack of laminations made of a magnetic material such as iron. The rotor core 62 includes a center opening 65 which runs axially through the center of the rotor 60 and which is intended to be mounted on the rotor shaft (not shown). The rotor core 62 also includes a circumferential series of nearly axial slots 64 near the outer diameter of the rotor 60. These slots may be disposed in a skewed or inclined relationship with respect to the longitudinal axis of the rotor. The squirrel cage windings are provided by an aluminum casting 66 disposed in and about the rotor core 62 comprising conductive bars 67 which fill the slots 64 and conductive end rings 68, 69 integral with the conductive bars.

This structure will have inherent resistance and reactance characteristics which are highly dependent on the proper construction of the rotor such as proper formation of the conductive bars in the slots 64. In addition, the skew characteristics of the rotor are largely determined by the angle of incline (i.e. skew) of the conductive bars off of the true longitudinal axis. However, variations of the properties of the magnetic material, the aluminum casting, the iron to aluminum insulation, etc. will produce variations in the effective electrical skew (i.e., the skew as measured by its effects on the electromagnetic field in the air gap).

Figure 5:
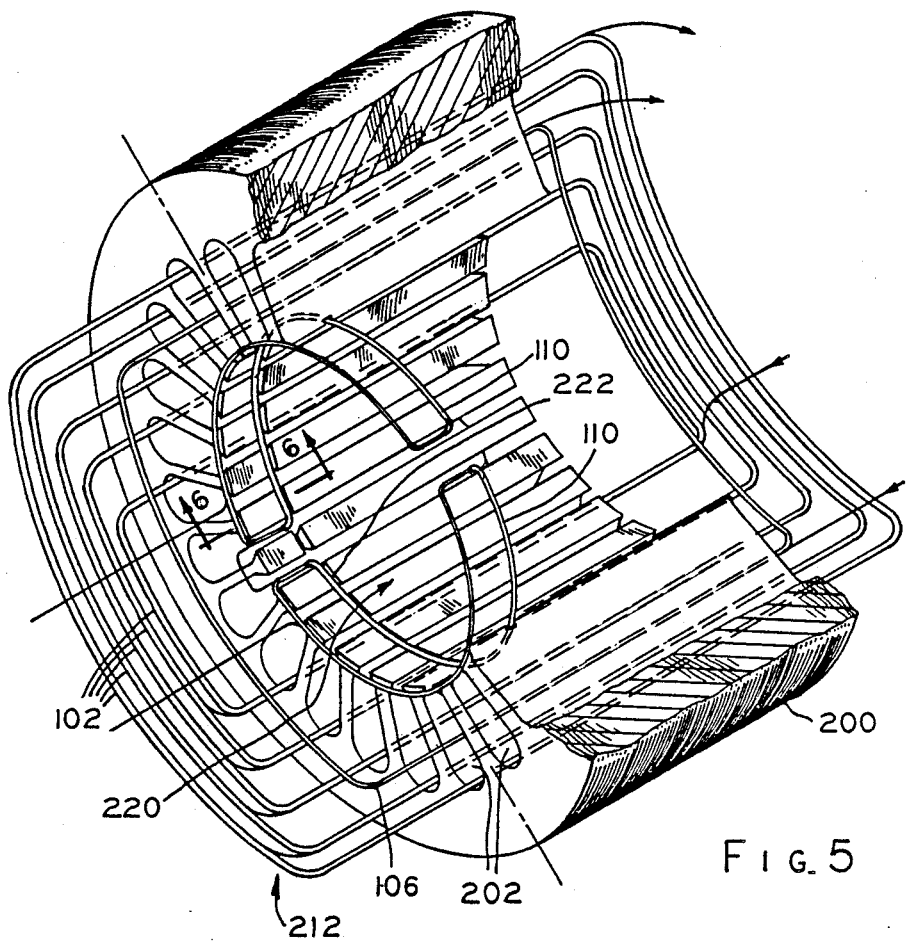
FIG. 5 is a cut-away diagrammatic view illustrating the structure of a specific embodiment of the test head of test apparatus illustrated in FIG. 3.
Figure 6:
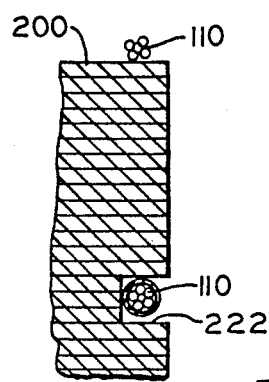
FIG. 6 is a cross sectional view illustrating the skew winding portion of a specific embodiment of the test head of the test apparatus illustrated in FIG. 3.

The test heads 26, 28 of the test fixtures 22, 24 have a unique construction which may best be understood by reference to FIGS. 4-8. The test heads 26, 28 comprise a structure utilizing a core of magnetic material 200 very similar to a conventional dynamoelectric machine stator as illustrated in FIG. 4. This core is formed in the conventional manner of a stack of laminations of magnetic material such as iron, shaped to provide a plurality of slots which permit a set of windings to be arranged in the slots as illustrated in FIG. 5.

Figure 7:
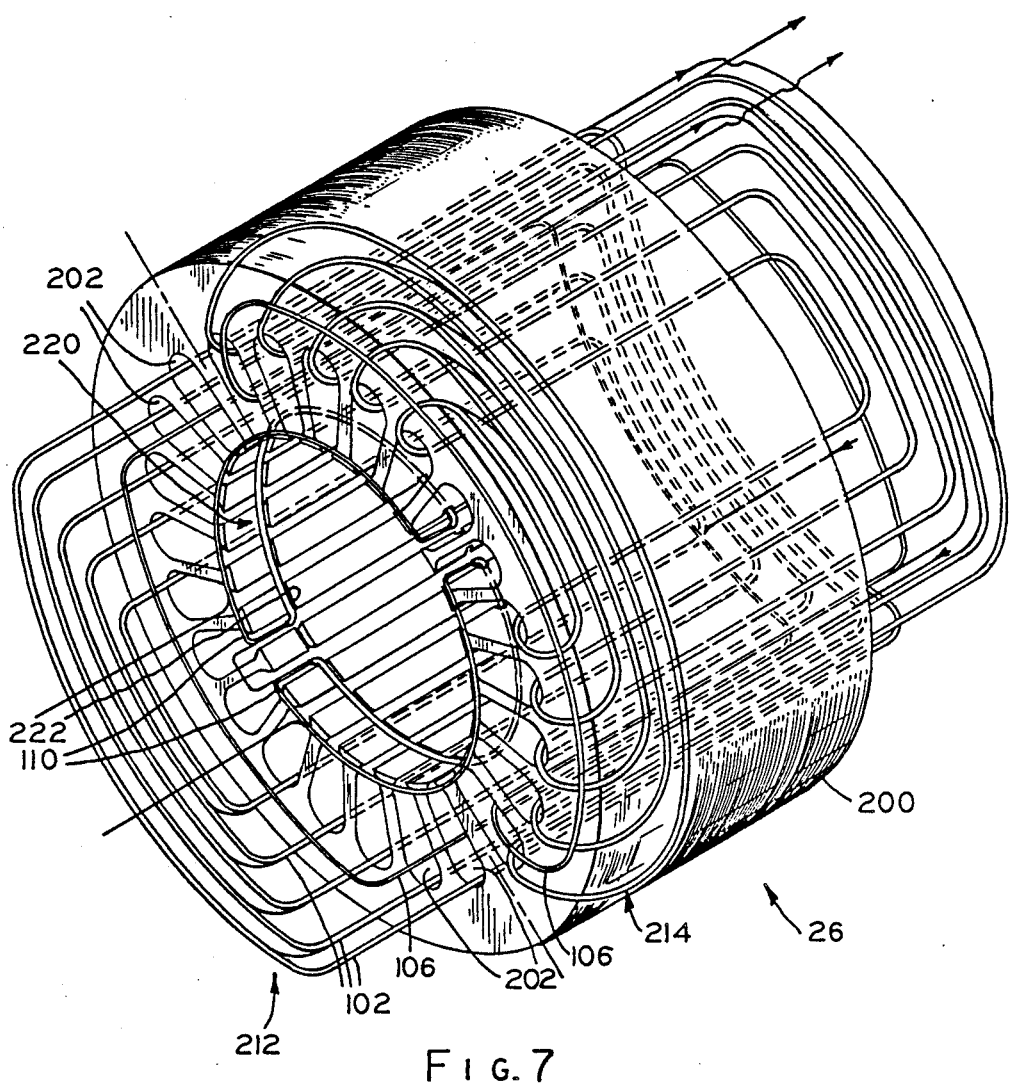
FIG. 7 is a diagrammatic view illustrating the structure of a specific embodiment of the test head of the test apparatus illustrated in FIG. 3.

FIG. 5 is a diagrammatic illustration of the structure of a test head 26 (also see FIG. 7). The test head includes a set of primary windings 210 which form at least one pair of poles 212, 214 as illustrated in FIG. 7. These primary windings form the exciting current carrying winding for the test head 26 which, when an alternating current is supplied during a rotor test, creates an alternating magnetic field in a center cylindrical cavity 220. For testing, the rotor is positioned within the center cavity 220 and rotated, thereby inducing voltages in the rotor. This results in induced currents in the rotor and consequently generation of magnetic flux by the rotor which is sensed by the pick-up coil 106. The pick-up coil 106 comprise a set of coil windings in which is generated a voltage representative of the voltage induced in the rotor. These coils are, in the illustrated embodiment, composed of a multiple turn loop (any number of turns may be used), as shown, coupled in series to provide the voltage signal. In the preferred embodiment, these voltage pick-up coils 106 are wound over the primary coils 102.

The test head 26 also includes a skew pick-up coil 110 located at one end of the test head structure 26. This skew pick-up coil 110 is positioned in quadrature with the poles 212, 214 and at the end of the core 200 to sense flux build-up at the end of the rotor due to the skew characteristics of the rotor. In the illustrated embodiment, the skew pick-up is composed of two multiple turn loops coupled in series, as shown, although other coupling configurations and any number of turns (N) may be used. The skew pick-up coils 110, in the illustrated embodiment, are positioned within a groove 222 near the end of the core 200, as may best be understood by reference to FIG. 6.

Figure 8:
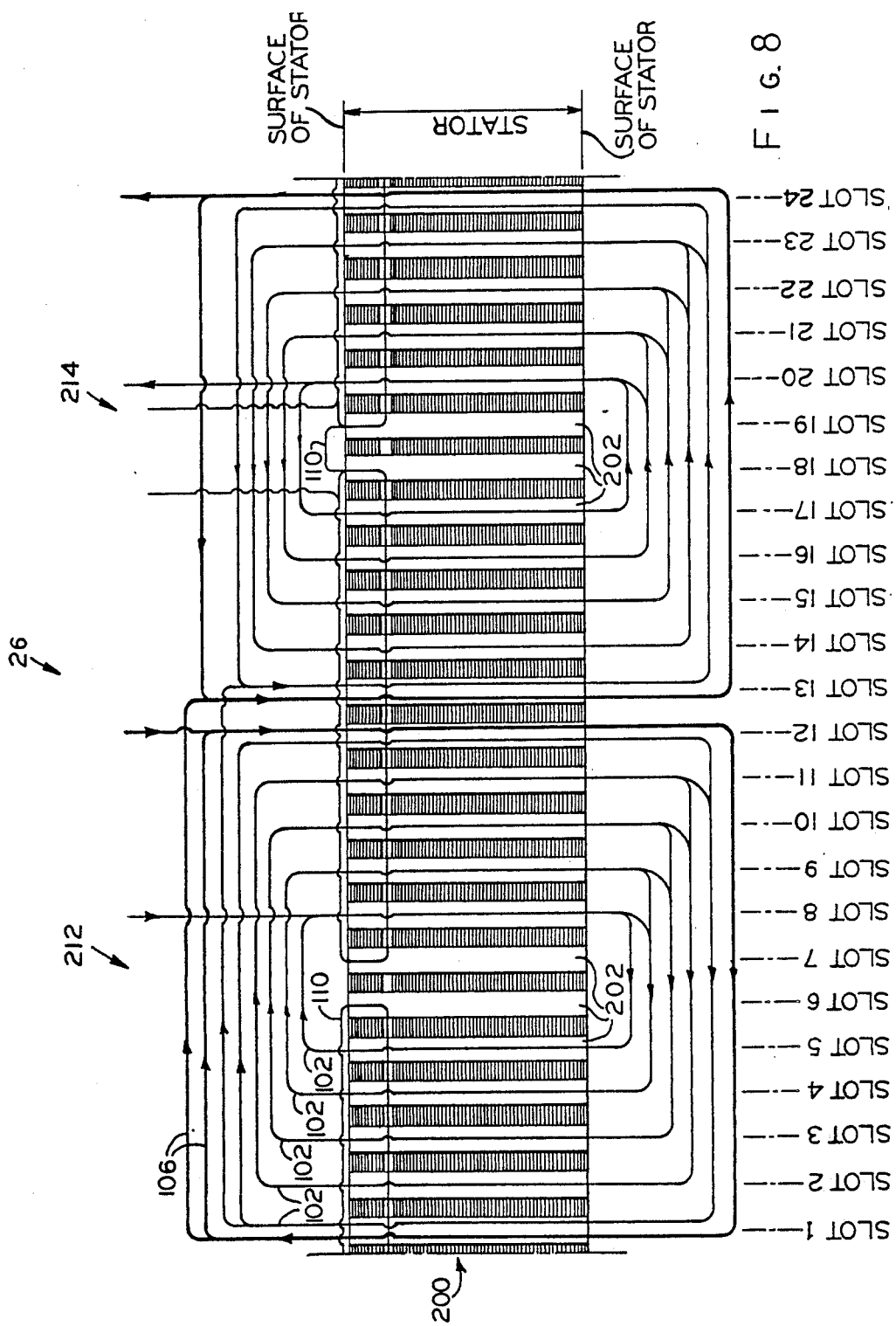
FIG. 8 is a diagrammatic view illustrating a laid open structure of a specific embodiment of the test head of the test apparatus illustrated in FIG. 3.

For a further understanding of the structure of the coils of the test head 26, reference may be made to FIG. 8 which shows a diagrammatic view of the test head 26 laid flat. The primary windings 102 are shown forming two poles 212, 214 with the voltage pick-up coils 106 wound in some of the slots among the primary coil windings 102. The skew pick-up coil 110 is shown in quadrature relationship to the primary windings at one end of the core 200.

Figure 3:
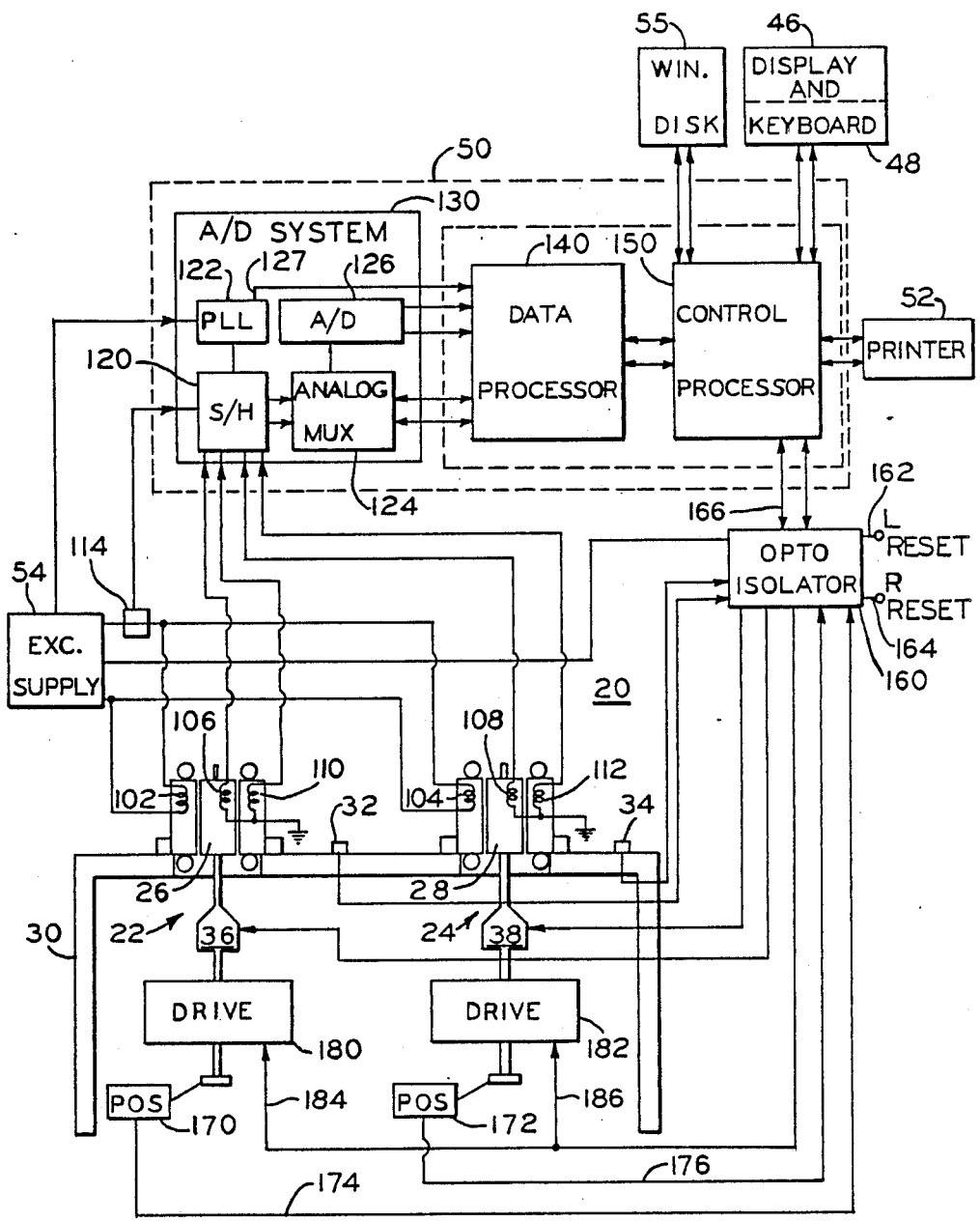
FIG. 3 is a detailed block diagram illustrating a specific embodiment of the dynamoelectric machine rotor test apparatus for testing squirrel cage rotors in accordance with the invention.

Referring now to FIG. 3, there is shown a detailed block diagram illustrating a specific embodiment of the dynamoelectric machine rotor test apparatus 20. Each test head 26, 28 includes an excitation means 102, 104 composed of the set of current carrying windings which produce an alternating magnetic field when energized by an alternating current of predetermined magnitude (e.g., 60 hz at 2.4 amps in the illustrated embodiment) coupled from the power supply 54, as shown. The magnetic field produced will magnetize a rotor rotated within the field producing magnetic flux which is dependent upon the rotor characteristics.

Each head 26, 28 also includes the voltage sensing pick-up coil 106, 108 responsive to the rotor induced magnetic flux which produces a voltage signal representative of the voltage induced in the rotor. The skew sensing pick-up coil 110, 112 is also located in the test head 26, 28 which produces an effective skew signal responsive to flux build-up at the end of the rotor due to the rotor's effective skew. Each of these sense signals is coupled to a sample and hold circuit 120, as shown (e.g., a Burr-Brown ADSHC-85). A current sensor 114 (e.g., a conventional current transformer), coupled as shown to the supply 54, senses the current provided to energize the test heads 26, 28 and couples a current sense signal to the sample and hold circuit 120.

Also coupled to the power supply 54 is a phase lock loop 122 (e.g., a National CD4046) which generates timing pulses which are phase locked to the exciting alternating current supplied to the test head windings 102, 104. In the illustrated embodiment, there are 32 pulses generated for each cycle of the exciting alternating current such that each pulse is generated at the same phase of the cycle for each succeeding cycle. These phase locked timing pulses are coupled, as shown, to the sample and hold circuit 120 to synchronize the sampling of the sense signals coupled from the voltage pick-up coil 106, the skew pick-up 110, and the current sensor 114. The phase locked timing signals are also coupled to a data processor 140 via a conductor 127, as shown.

The sample and hold circuit 120 and the phase locked loop circuit 122 are part of an analog to digital system 130 which also includes an analog multiplexor 124 (e.g., an Analog Devices AD7506) and an analog to digital converter 126 (e.g., Analog Devices ADC1131 high speed, 14 bit converter) configured as shown. The analog to digital system 130 is a subsystem of the data acquisition and processing circuit 50. The data acquisition and processing circuit 50 controls the acquisition of the test data and processes the data to produce useful test results as well as rotor pass/fail determinations. The data acquisition and processing circuit 50 also includes the data processor to 140 (e.g., an Intel 86/14 microcomputer) and a control processor 150 (e.g., an Intel 86/35 microcomputer) as shown. This multi-computer system provides highly efficient data acquisition and processing, although other configurations (e.g., a single microcomputer system) may also be used.

During a rotor test, the sample and hold circuit 120 simultaneously samples each of the sense signals each time a timing pulse from the phase locked loop 122 occurs. Simultaneous sampling of current and voltage sense signals permits calculation of a power value (W) (note: simultaneous sampling of the skew signal is not needed to permit the calculation of a power value). These samples, taken by the sample and hold circuit 120 are coupled to an analog multiplexer circuit 124, as shown. The analog multiplexer 124 multiplexes the samples sequentially, under the control of the data processor 140, to an analog to digital converter 126. The analog to digital converter digitizes the samples and couples the digitized samples to the data processor 140. The digitized samples coupled to the data processor 140 are processed to reduce the data to usable form.

Figure 15A:
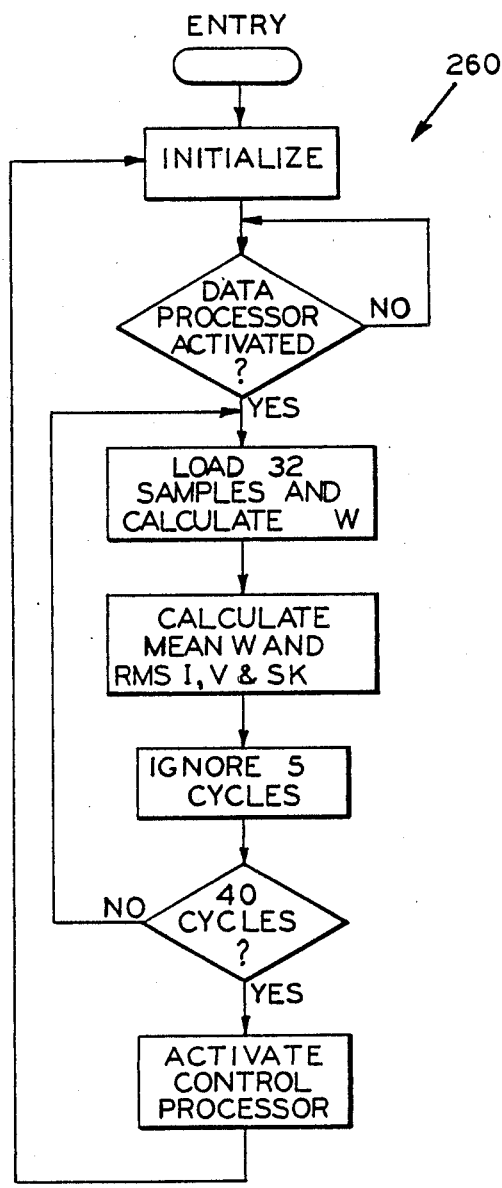
FIG. 15A is a flow diagram illustrating the program flow for one embodiment of the data processor of FIG. 3.

In the illustrated embodiment, the processor 140 acquires 32 samples in a cycle of the exciting alternating current (i.e., at 60 hz, one sample every 520 microseconds), then ignores samples for the next five cycles, and samples again for 32 samples. (The flow of program control for the processor 140 may be more fully understood by reference to the flow chart 260 illustrated in FIG. 15A in conjunction with the following description). This pattern is continued for a total of forty sampling cycles of 32 samples each to complete one rotor test sampling sequence in four seconds. Once the data is acquired for each sample cycle, the processor 140 multiplies each current sample by the corresponding voltage sample to obtain a power value W (where W is power into the rotor). The 32 samples of the voltage signal, current signal, skew signal, and power value are then processed to obtain four test values which are a mean power value (W), and a root means square (rms) value for the voltage (V), current (I), and skew (SK) signals. This process is repeated 40 times, once for each sample cycle, thereby obtaining 40 sets of the four test values.

Figure 15B:
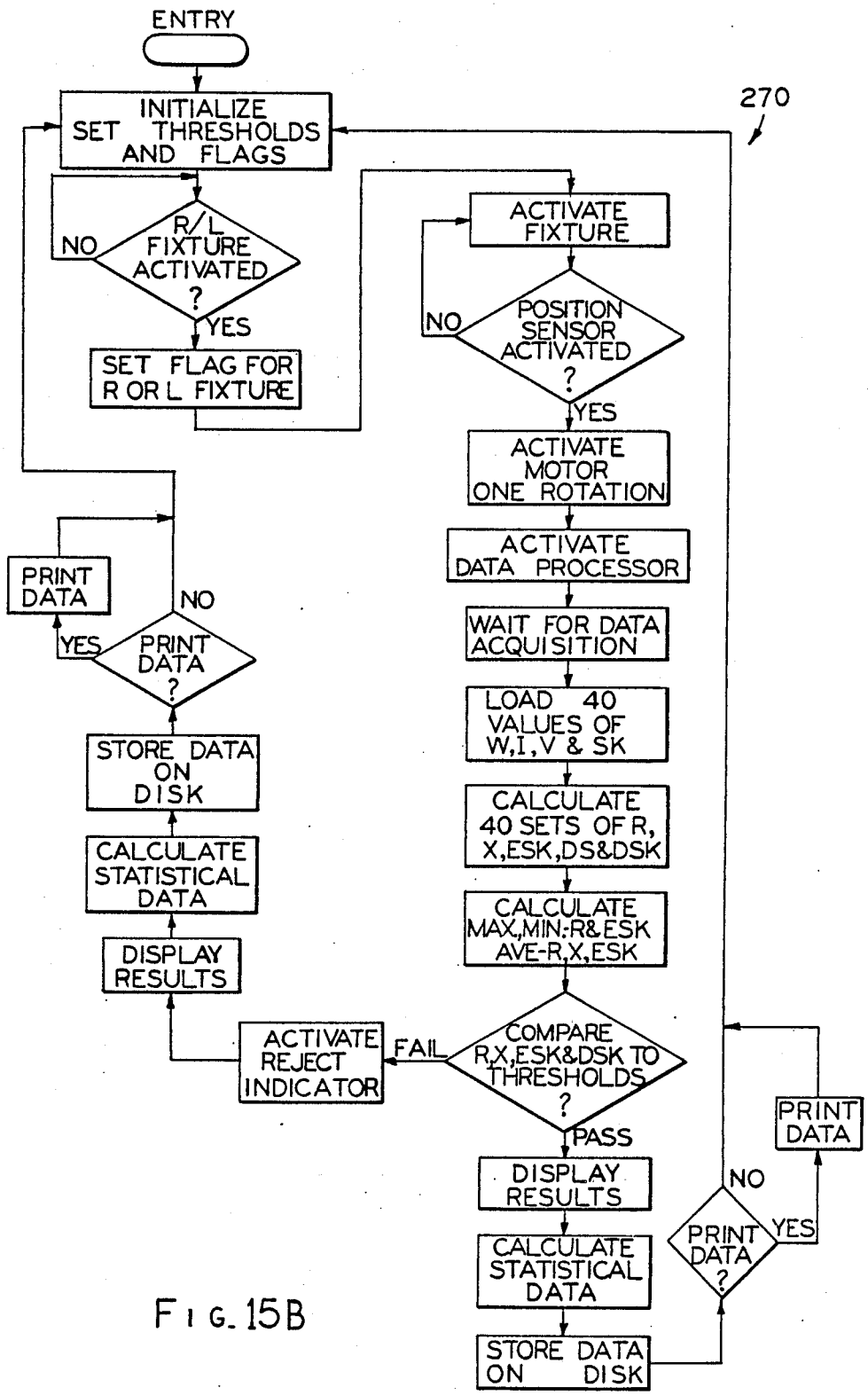
FIG. 15B is a flow diagram illustrating the program flow for one embodiment of the control processor of FIG. 3B.

These forty sets of test values are coupled from the data processor 140 to the control processor 150 at the end of a rotor test sequence. (The flow of program control for the control processor 150 may be more fully understood by reference to the flow chart 270 illustrated in FIG. 15B in conjunction with the following description). The control processor 150 then determines a mean resistance (R), reactance (X), and effective skew (ESK) for the rotor from the 40 test values, as well as the range of the 40 values for the resistance (referred to as dissymmetry, DS) and the effective skew (referred to as skew dissymmetry, DSK).

Each resistance value (R) is determined by the formula $$R = W/I^2.$$

Each reactance value is determined by the formula $$X = ((VI)^2 - W^2)^{\frac{1}{2}}/I^2.$$

The effective skew is determined by the formula $$ESK = SK/(I^2 \times N)$$

where N=the number of turns of the skew pick-up coil.

Once the resistance, reactance, and effective skew values have been determined, the data is scanned to determine the maximum and minimum resistance and effective skew values. In addition, an average value of resistance, reactance, and effective skew is determined by summing the forty values for each and dividing by forty. These values are stored in internal memory within the data processor 140.

After all of the values have been calculated, the average value for resistance, reactance, and effective skew are each compared to predetermined maximum and minimum threshold values. In addition, the dissymmetry value is compared to a predetermined maximum. The maximum and minimum values may be entered through the key board 48 by the operator prior to the beginning of a test run. If the calculated values for the rotor are within the predetermined maximum and minimum threshold value, then the rotor is passed as a good rotor. However, if the rotor has any value outside of the predetermined limits, a fail (reject) indication is provided to the operator by means of an indicator such as a light or audible signal (not shown) to indicate a defective rotor. The reject signals to activate the fail indicators are generated on outputs 162 and 164, as shown.

In addition to the calculated values, additional statistical information is also determined and stored on a Winchester magnetic disk 55 coupled to the control processor 150, as shown. Among the types of data stored on the Winchester disk 55 are totals of the number of passed rotors, the number of fail rotors including how many failed for each threshold, running sums of each of the calculated values, and running sums of the squares of each of the values. This data permits the determination of statistical information over numerous tests of a test run, including such information as averages and standard deviation. All the calculated values of resistance, reactance, effective skew, dissymmetry, and skew dissymmetry for each test are displayed on the display 46 at the end of a test. In addition, the printer 52 may be used to print the results of a test as well as the statistical data. The printer 52 is activated by the operator via commands from the keyboard 48.

The control processor 150 also controls the sequence of events that occur during a test. Various input and output signals are coupled between the control processor 150 and an opto-isolator 160 (e.g., an opto-22) via a bus 166, as shown. The opto-isolator provides a control interface to the test fixtures 22, 24. The start switches 32, 34 are coupled to the opto-isolator 160 which couples the start signal to the processor in response to activation of one (i.e., Right (R) or Left (L)) of the start switches 32, 34. In response, the control processor 150 couples a control signal through the opto-isolator 160 to the appropriate retraction and drive mechanism 36, 38 (described in greater detail hereinafter with reference to FIGS. 9-14) which activates the mechanism 36, 38 thereby starting the rotor test. The retraction and drive mechanism 36, 38, in response to activation, retracts a rotor placed on a test head 26, 28. When the rotor is fully retracted such that it is in place for testing, a position sensor 170, 172 (e.g., a conventional limit switch) generates a position signal which is coupled through the opto-isolator 160 to the control processor 150 via conductors 174, 176. In response to the position signal, the control processor 150 generates a drive signal which is coupled through the opto-isolator 160 to the drive motors 180, 182 via the conductors 184, 186. This drive signal activates the motor 180, 182 to rotate the rotor.

In the illustrated embodiment, the rotor is rotated at a rate of 1 revolution in four seconds, and is rotated one full rotation for a complete test sequence (i.e., rotation for four seconds). During the four second test sequence, the data acquisition and processing system 50 acquires the desired data after which three seconds are utilized for the data to be processed. The use of the two fixture system permits the operator to set up a rotor on the unused fixture during this seven second test sequence. Thus, the dual fixture system allows more efficient testing by reducing delays due to the operator set up time. It also increases the cost effectiveness of the apparatus because both fixtures can be controlled with a single processing system.

During operation, a test is initiated by an operator by placing a rotor to be tested onto the test head, for example, head 26. The operator then initiates the test sequence by activating the start button 32, which signals the control processor 150 to activate the retraction mechanism thereby retracting the rotor to the test position. Once fully retracted the position sensor 170 generates a signal coupled to the control processor 150 which causes the control processor 150 to generate the motor activation signal, which activates the motor 180 to rotate the rotor. The rotor is rotated at a rate of one rotation in four seconds, and one complete test sequence is completed in one rotation. During the four second rotation period the voltage sensor 106, skew sensor 110, and current sensor 114 are sampled by the sample and hold circuit 120.

The sample and hold circuit 120 is timed synchronously with the exciting alternating current applied to the coils 102 by timing signals from the phase lock loop circuit 122. During this test sequence, 32 samples are taken during one cycle of the alternating current exciting signal, and one set of samples are taken every sixth cycle producing a total of forty sets of data. This data is coupled to the data processor 140 which does the initial processing of the data and couples the results to the control processor 150. The control processor 150 then performs the final processing, calculating resistance, reactance, skew, dissymmetry and skew dissymmetry. These values are displayed on the display 46 and may be printed on the printer 52 in response to commands entered through the keyboard 58. Information to permit statistical analysis over a series of tests is then stored on a Winchester disk 55.

Figure 9:
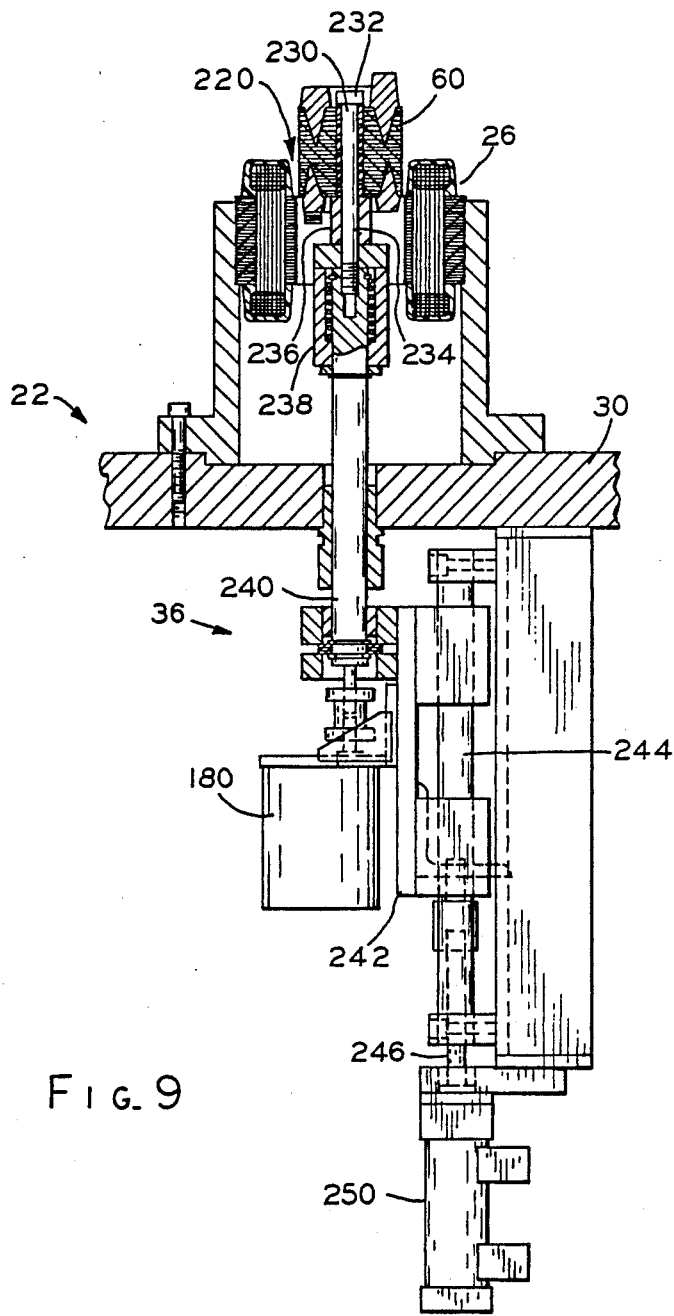
FIG. 9 is a diagrammatic view illustrating a specific embodiment of the test fixture structure of the test apparatus illustrated in FIG. 1 with the test fixture in the rotor extended position.
Figure 10:
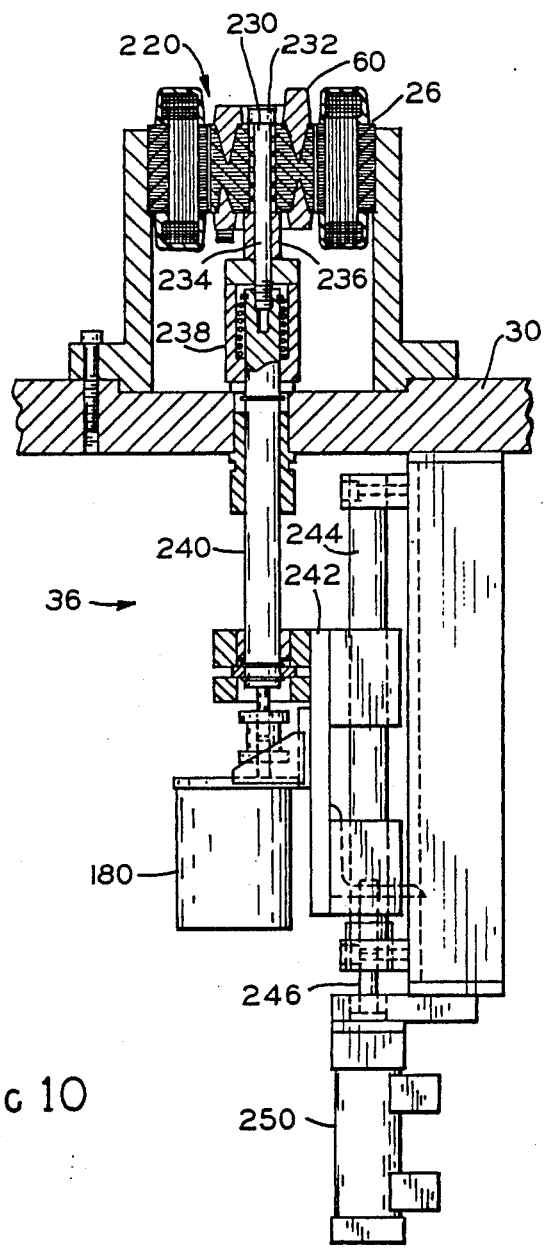
FIG. 10 is a diagrammatic view illustrating a specific embodiment of the test head and mechanical structure of the test apparatus illustrated in FIG. 1 with the test head in the rotor retracted position.

Referring now to FIG. 9, there is shown a detailed diagrammatic view illustrating a specific embodiment of the test fixture structure 22 on which a rotor 60 has been placed in the extended position. During operation, the rotor 60 is retracted to the test position as illustrated in FIG. 10. The test fixture 22 comprises the test head 26 and the retraction and drive mechanism 36. Located coaxially at the center of the center cavity 220 of the test head 26 is a spindle 230 over which the rotor 60 may be placed, as shown.

The spindle 230 comprises a shaft 234 having an upper cylindrical cap 232 with a greater diameter than the shaft 234, and an annular ring 236 at the lower end through which the shaft 230 is slidably positioned, as shown. The annular ring 236 is mounted on a cylindrical mount 238 which is coupled by a spring loaded coupling to a shaft 240. The shaft 240 is slidably mounted in an aperture in the test stand 30 as shown. The shaft 230 is threadedly coupled to the shaft 240 and the shaft 240 is coupled to a drive motor 280 which rotates the rotor 60 when the motor is activated. This shaft-motor assembly is mounted on a bracket 242 which slidably engages a slide shaft 244. The bracket 242 is connected to a shaft 246 of a hydraulic cylinder 250 which is powered by an external source (not shown).

In the extended position, the rotor 60 extends above the test head 26 when the entire retraction and drive mechanism 36 is in its upper-most position as shown in FIG. 9. When activated, the hydraulic cylinder 250 retracts the shaft 246 lowering the retraction and drive mechanism 36 to the position shown in FIG. 10. This lowers the rotor to the retracted position within the central cavity 220 of the test head 26. The rotor is then rotated by the drive motor 180 which is activated when a position sensor (see FIG. 3) detects that the mechanism 36 is in the retracted position.

The rotor 60 is tightly held in position during rotation by a clutch mechanism more readily understood by reference to FIGS. 11-14. FIG. 11 is an expanded view of the top portion of the test fixture 22 in the extended position. The spindle 230, as illustrated in FIG. 11, comprises a set of annular sleeves 252 slidably positioned around a shaft 234, as shown. Between each sleeve 252 is an o-ring 254. These elements are held in place by the annular ring 236 and the cap 232. In the extended position, the o-rings are not compressed, and therefore do not extend in the radial direction beyond the edges of the annular sleeves 252, as illustrated in FIG. 12. Thus, the rotor 60 can easily slide over the spindle 230. However, when in the retracted position, as illustrated in FIG. 13, the annular ring 236 is pushed up against the annular sleeves 252 due to the movement of the shaft 234 downward. This compresses the o-rings 254 causing them to extend radially beyond the edge of the annular sleeves 252 contacting the inner surface of the rotor center cavity as illustrated by FIG. 14. As a result, the rotor 60 is securely held in place by the frictional force exerted on the rotor 60 by the extended o-rings 254. Thus, the rotor can be easily mounted on the spindle 230 when in the extended position but the rotor is securely held when in the retracted position.

Preferred embodiments of the novel method and apparatus for testing dynamoelectric machine rotors have been described for the purpose of illustrating the manner in which the invention may be made and used. It should be understood, however, that implementation of other variations and modifications of the invention in its various aspects will be apparent to those skilled in the art, and that the invention is not limited by the specific embodiments described. It is therefore contemplated to cover any and all modifications, variations or equivalents that fall within the true spirit and scope of the basic underlying principles disclosed and claimed herein.

What is claimed is:

1. A method for testing dynamoelectric machine rotors, comprising the steps of:
   imparting angular movement to a rotor, and magnetizing the rotor utilizing alternating current during such angular movement;
   generating a voltage signal in response to magnetic flux generated by the rotor in response to the magnetization of the rotor during rotation;
   sensing the magnitude of the alternating current utilized to magnetize the rotor and generating a current signal responsive thereto; and
   determining at least one of the resistance and reactance of the rotor based upon the voltage signal and current signal.

2. The method of claim 1 further comprising the steps of sensing the effective electrical skew of the rotor and generating an effective skew signal responsive thereto, and wherein the step of determining further comprises calculating an effective electrical skew value in response to the effective skew signal.

3. The method of claim 2 wherein the step of determining further comprises the step of simultaneously sampling the current signal and voltage signal in synchronization with the alternating current to produce sampled signals.

4. The method of claim 3 wherein the step of simultaneously sampling further comprises generating synchronization pulses to synchronize the sampling with the alternating current.

5. The method of claim 3 wherein the step of simultaneously sampling further comprises converting the sampled signals to digital data.

6. The method of claim 5 further comprising the step of processing the digital data to determine the resistance and reactance of the rotor.

7. The method of claim 6 further comprising the step of processing the digital data to determine an effective skew value of the rotor.

8. The method of claim 7 further comprising the step of processing the digital data to determine dissymmetry and skew dissymmetry values of the rotor.

9. The method of claim 8 further comprising the steps of comparing at least one of the resistance, reactance, effective skew, dissymmetry and skew dissymmetry values to respective predetermined limits and generating a failure indication responsive to one of the values falling outside its respective predetermined limits.

10. The method of claim 1, wherein the step of imparting angular movement comprises the steps of creating a slip-free contact with the rotor, retracting the rotor into a test head and rotating the rotor within the test head for a predetermined amount of rotations at a predetermined rate in response to activation of a start switch.

11. The method of claim 10 wherein the step of creating a slip-free contact comprises compressing a compressible o-ring mounted on a spindle adapted for axially receiving the rotor to cause the o-ring to expand radially against the rotor to thereby form a gripping contact.

12. The method of claim 2 wherein the step of generating an effective skew signal further comprises the step of sampling the effective skew signal in synchronization with the alternating current to produce sampled effective skew signals.

13. The method of claim 12 wherein the step of determining further comprises the step of converting the sampled effective skew signals to digital data and processing the digital data to calculate an effective skew value of the rotor.

14. A method for testing dynamoelectric machine rotors, comprising the steps of:
   imparting angular movement to a rotor, and magnetizing the rotor utilizing an alternating current during said angular movement;
   sensing at least one characteristic related to at least one selected electrical characteristic of the rotor and generating sense signals in response thereto; and,
   calculating a value of at least one selected electrical characteristic of the rotor automatically in response to the sense signals.

15. The method of claim 14 further comprising the steps of digitizing the sense signals to provide digital sense signals and processing the digital sense signals to determine a calculated value for at least one selected electrical characteristic of the rotor.

16. The method of claim 14 wherein the step of sensing comprises sensing a plurality of different selected electrical characteristics and generating a plurality of sense signals and wherein the step of calculating comprises calculating values of a plurality of different electrical characteristics of the rotor in response to the plurality of sense signals.

* * * * *